United States Patent
Xu

(10) Patent No.: US 11,236,621 B2
(45) Date of Patent: **\*Feb. 1, 2022**

(54) METHOD FOR FORMING SINGLE CRYSTAL COMPONENTS USING ADDITIVE MANUFACTURING AND RE-MELT

(71) Applicant: Raytheon Technologies Corporation, Farmington, CT (US)

(72) Inventor: JinQuan Xu, East Greenwich, RI (US)

(73) Assignee: Raytheon Technologies Corporation, Farmington, CT (US)

( \* ) Notice: Subject to any disclaimer, the term of this patent is extended or adjusted under 35 U.S.C. 154(b) by 30 days.

This patent is subject to a terminal disclaimer.

(21) Appl. No.: 16/526,519

(22) Filed: Jul. 30, 2019

(65) Prior Publication Data

US 2019/0353039 A1 Nov. 21, 2019

Related U.S. Application Data

(62) Division of application No. 15/106,875, filed as application No. PCT/US2015/012221 on Jan. 21, 2015, now abandoned.

(Continued)

(51) Int. Cl.
*B22C 9/04* (2006.01)
*F01D 5/28* (2006.01)
(Continued)

(52) U.S. Cl.
CPC .................. *F01D 5/28* (2013.01); *B22C 7/02* (2013.01); *B22C 9/04* (2013.01); *B22C 9/10* (2013.01);
(Continued)

(58) Field of Classification Search
CPC ... F01D 5/28; F01D 5/18; F01D 5/187; B22D 27/045; B22C 9/10; B22C 7/02;
(Continued)

(56) References Cited

U.S. PATENT DOCUMENTS 7,036,236 B1 5/2006 Drescher et al.
7,404,986 B2 7/2008 Makhotkin et al.
(Continued)

FOREIGN PATENT DOCUMENTS

EP 2359959 A1 8/2011

OTHER PUBLICATIONS

Munish et al., "Rapid Casting Solutions: A Review", Rapid Prototyping Journal, vol. 17, No. 5, Aug. 2, 20011, p. 328-350.
(Continued)

*Primary Examiner* — Jun S Yoo
(74) *Attorney, Agent, or Firm* — Getz Balich LLC

(57) ABSTRACT

A method is provided for manufacturing a component. This method includes additively manufacturing a crucible for casting of the component. A metal material is directionally solidified within the crucible to form a metal single crystal material. A sacrificial core is removed to reveal a metal single crystal component with internal passageways. A component is provided for a gas turbine engine that includes a metal single crystal material component with internal passageways. The metal single crystal material component was additively manufactured of a metal material concurrently with a core that forms the internal passageways. The metal material was also remelted and directionally solidified.

13 Claims, 15 Drawing Sheets

Related U.S. Application Data

(60) Provisional application No. 61/929,739, filed on Jan. 21, 2014.

(51) Int. Cl.

| | | |
|---|---|---|
| *B22C 9/10* | (2006.01) | |
| *B22C 7/02* | (2006.01) | |
| *B22D 27/04* | (2006.01) | |
| *B22F 5/00* | (2006.01) | |
| *B33Y 70/00* | (2020.01) | |
| *F01D 5/18* | (2006.01) | |
| *C30B 29/52* | (2006.01) | |
| *C30B 11/00* | (2006.01) | |
| *B22F 10/20* | (2021.01) | |
| *B33Y 80/00* | (2015.01) | |
| *B22F 5/04* | (2006.01) | |
| *B33Y 10/00* | (2015.01) | |

(52) U.S. Cl.
CPC ........... *B22D 27/045* (2013.01); *B22F 5/007* (2013.01); *B22F 10/20* (2021.01); *B33Y 70/00* (2014.12); *B33Y 80/00* (2014.12); *C30B 11/00* (2013.01); *C30B 29/52* (2013.01); *F01D 5/18* (2013.01); *F01D 5/187* (2013.01); *B22F 5/04* (2013.01); *B22F 2999/00* (2013.01); *B33Y 10/00* (2014.12); *F05D 2220/32* (2013.01); *F05D 2230/21* (2013.01); *F05D 2230/50* (2013.01); *F05D 2260/204* (2013.01); *F05D 2300/10* (2013.01); *F05D 2300/607* (2013.01); *Y02P 10/25* (2015.11)

(58) Field of Classification Search
CPC .... B22C 9/04; Y02P 10/25; B22F 5/04; B22F 2999/00; B22F 10/20; B22F 5/007; F05D 2300/607; F05D 2260/204; F05D 2230/21; F05D 2220/32; F05D 2230/50; F05D 2300/10; B33Y 10/00; B33Y 70/00; B33Y 80/00; C30B 29/52; C30B 11/00
See application file for complete search history.

(56) References Cited

U.S. PATENT DOCUMENTS

| | | |
|---|---|---|
| 7,509,734 B2 | 3/2009 | Memmen et al. |
| 7,704,335 B2 | 4/2010 | Bewlay et al. |
| 7,779,890 B2 | 8/2010 | Frasier et al. |
| 8,087,446 B2 | 1/2012 | Frasier et al. |
| 8,216,508 B2 | 7/2012 | Woodfield et al. |
| 8,343,591 B2 | 1/2013 | Neal et al. |
| 8,419,857 B2 | 4/2013 | Neal |
| 8,434,543 B2 | 5/2013 | Morris et al. |
| 8,506,715 B2 | 8/2013 | Neal |
| 8,540,010 B2 | 9/2013 | Przeslawski et al. |
| 8,550,144 B2 | 10/2013 | Frasier et al. |
| 8,590,595 B2 | 11/2013 | Cretegny et al. |
| 8,597,440 B2 | 12/2013 | Lupulescu et al. |
| 9,435,211 B2* | 9/2016 | Xu .............. B22C 9/10 |
| 9,452,474 B2* | 9/2016 | Xu .............. B22C 9/12 |
| 9,718,127 B2* | 8/2017 | Xu ............ B22D 27/045 |
| 9,770,758 B2* | 9/2017 | Xu ............ B23K 1/0018 |
| 2002/0185243 A1* | 12/2002 | Frank .............. B22C 9/12 164/31 |
| 2004/0231822 A1* | 11/2004 | Frasier ............ B29C 64/165 164/122.2 |
| 2005/0040147 A1 | 2/2005 | Hoebel et al. |
| 2009/0165988 A1 | 7/2009 | Rockstroh et al. |
| 2010/0025001 A1 | 2/2010 | Lee et al. |
| 2013/0004680 A1 | 1/2013 | Godfrey et al. |
| 2013/0195673 A1 | 8/2013 | Godfrey et al. |
| 2013/0280081 A1* | 10/2013 | Propheter-Hinckley ............ B22C 9/101 416/223 R |
| 2013/0316084 A1 | 11/2013 | Szuromi et al. |
| 2014/0163717 A1* | 6/2014 | Das ................ B22F 7/062 700/119 |
| 2014/0314581 A1* | 10/2014 | McBrien ............. C30B 29/52 416/96 R |
| 2016/0115820 A1* | 4/2016 | Prentice ............. F01D 5/147 415/200 |

OTHER PUBLICATIONS

Cheah et al. "Rapid Prototyping and Tooling Techniques: A Review of Applications for Rapid Investment Casting", The International Journal of Advanced Manufacturing Technology, vol. 25, No. 3-4, Feb. 1, 2005, p. 308-320.

\* cited by examiner

METHOD FOR FORMING SINGLE CRYSTAL COMPONENTS USING ADDITIVE MANUFACTURING AND RE-MELT

CROSS-REFERENCE TO RELATED APPLICATION

This application is a divisional of U.S. patent application Ser. No. 15/106,875 filed Jun. 21, 2016, which is a national stage application of PCT Patent Application No. PCT/US2015/012221 filed Jan. 21, 2015, which claims priority to U.S. Provisional Patent Application No. 61/929,739 filed Jan. 21, 2014, each of which is hereby incorporated herein by reference in its entirety.

BACKGROUND

The present disclosure relates to components for a gas turbine engine and, more particularly, to the additive manufacture thereof.

Gas turbine engines typically include a compressor section to pressurize airflow, a combustor section to burn a hydrocarbon fuel in the presence of the pressurized air, and a turbine section to extract energy from the resultant combustion gases.

In the gas turbine industry, methods to directly fabricate components with internal passageways, such as blades and vanes within the turbine section, using additive manufacturing invite much attention. Since a component is produced in a continuous process in an additive manufacturing operation, features associated with conventional manufacturing processes such as machining, forging, welding, casting, etc. can be eliminated leading to savings in cost, material, and time.

An inherent feature of components fabricated by additive manufacturing is that the microstructures are polycrystalline. However, numerous types of turbine components require a single crystal microstructure to withstand the high temperature, high stress operating environment in a hot gas stream.

SUMMARY

A method of manufacturing a component, according to one disclosed non-limiting embodiment of the present disclosure, includes additively manufacturing a crucible for casting of the component. A metal material within the crucible is directionally solidified to form a metal single crystal material. A sacrificial core is removed to reveal a metal single crystal component with internal passageways.

In a further embodiment of the present disclosure, the metal material is selected from the group consisting of a nickel based superalloy, cobalt based superalloy, iron based superalloy, and mixtures thereof.

In a further embodiment of the present disclosure, the crucible is additively manufactured of a material selected from the group consisting of a ceramic material, a refractory metal alloy and hybrids thereof.

In a further embodiment of the present disclosure, the metal material is a powder.

In a further embodiment of the present disclosure, the crucible includes a core at least partially within a shell. The core at least partially defines the internal passageways within the component.

In a further embodiment of the present disclosure, the method includes forming the core via additive manufacturing.

In a further embodiment of the present disclosure, the method includes forming the shell via additive manufacturing.

In a further embodiment of the present disclosure, the core at least partially defines the internal passageways within the component.

A method of manufacturing a component, according to another disclosed non-limiting embodiment of the present disclosure, includes additively manufacturing the component of a metal material. A core is additively manufactured at least partially within the component. The additively manufactured component and the additively manufactured core are at least partially encased within a shell. The additively manufactured component is melted. The metal material of the additively manufactured component is directionally solidified to form a metal single crystal material component. The shell and the additively manufactured core are removed to reveal a metal single crystal component with internal passageways.

In a further embodiment of the present disclosure, the metal material is a powder.

In a further embodiment of the present disclosure, the core at least partially defines the internal passageways within the component.

In a further embodiment of the present disclosure, the method includes concurrently additively manufacturing the component of a metal material and the core within the component.

In a further embodiment of the present disclosure, the core at least partially defines microchannels within the component.

In a further embodiment of the present disclosure, the microchannels are additively manufactured of a refractory material and the internal passageways are manufactured of a ceramic material.

In a further embodiment of the present disclosure, the additive manufacturing is performed by a multi-powder bed system.

In a further embodiment of the present disclosure, the method includes applying a wax material at least partially onto the component.

In a further embodiment of the present disclosure, the method includes melting the wax material prior to melting the additively manufactured component.

In a further embodiment of the present disclosure, the method includes applying the wax material to an airfoil portion of the component.

A component for a gas turbine engine, according to another disclosed non-limiting embodiment of the present disclosure, includes a metal single crystal material component with internal passageways, where the metal single crystal material component has been additively manufactured of a metal material concurrently with a core that forms the internal passageways, and where the metal material has been remelted and directionally solidified.

In a further embodiment of the present disclosure, the metal single crystal material component includes an airfoil.

In a further embodiment of the present disclosure, the metal single crystal material component is a rotor blade.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
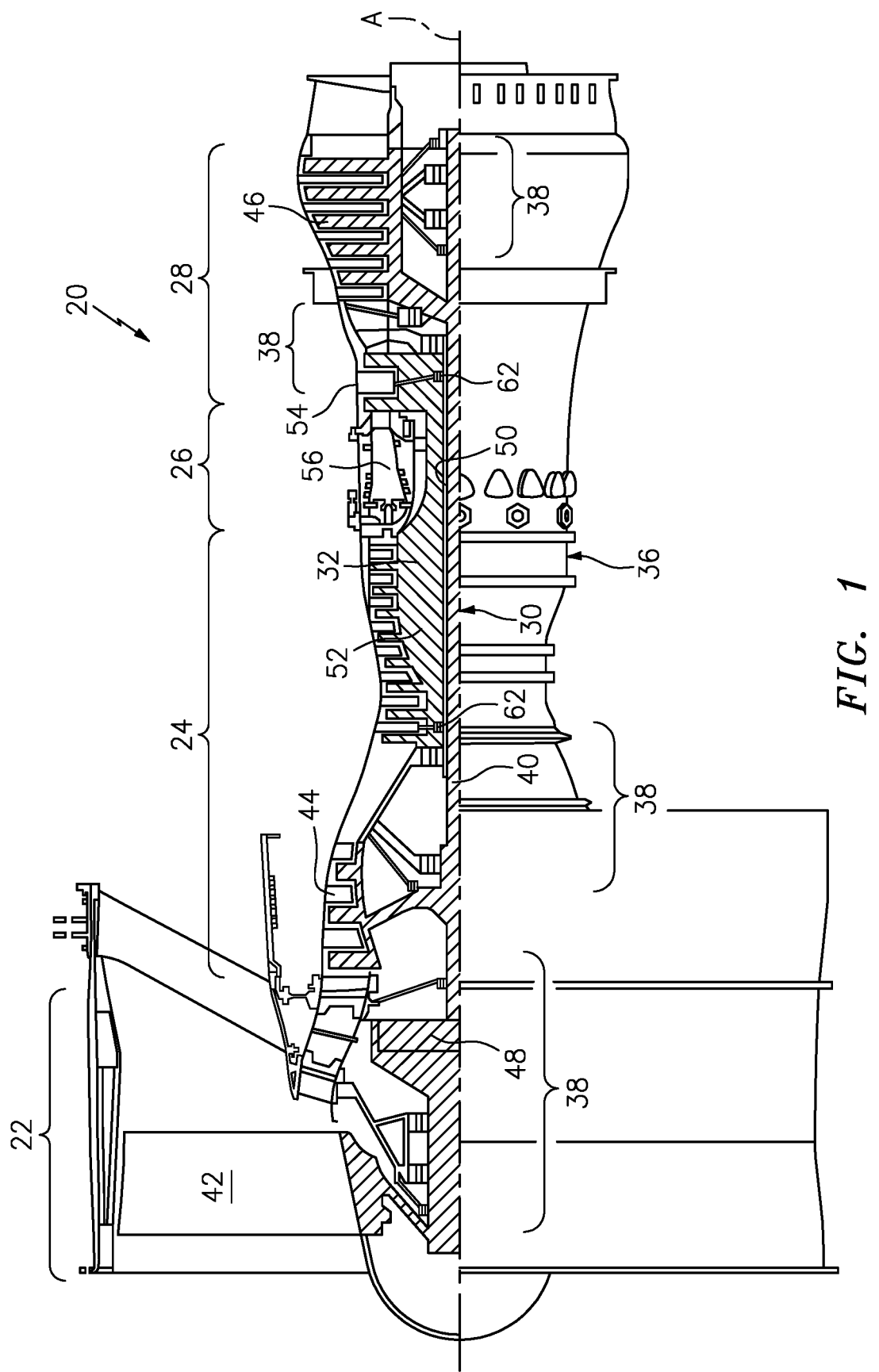
FIG. 1 is a schematic cross-section of an example gas turbine engine architecture.
Figure 2:
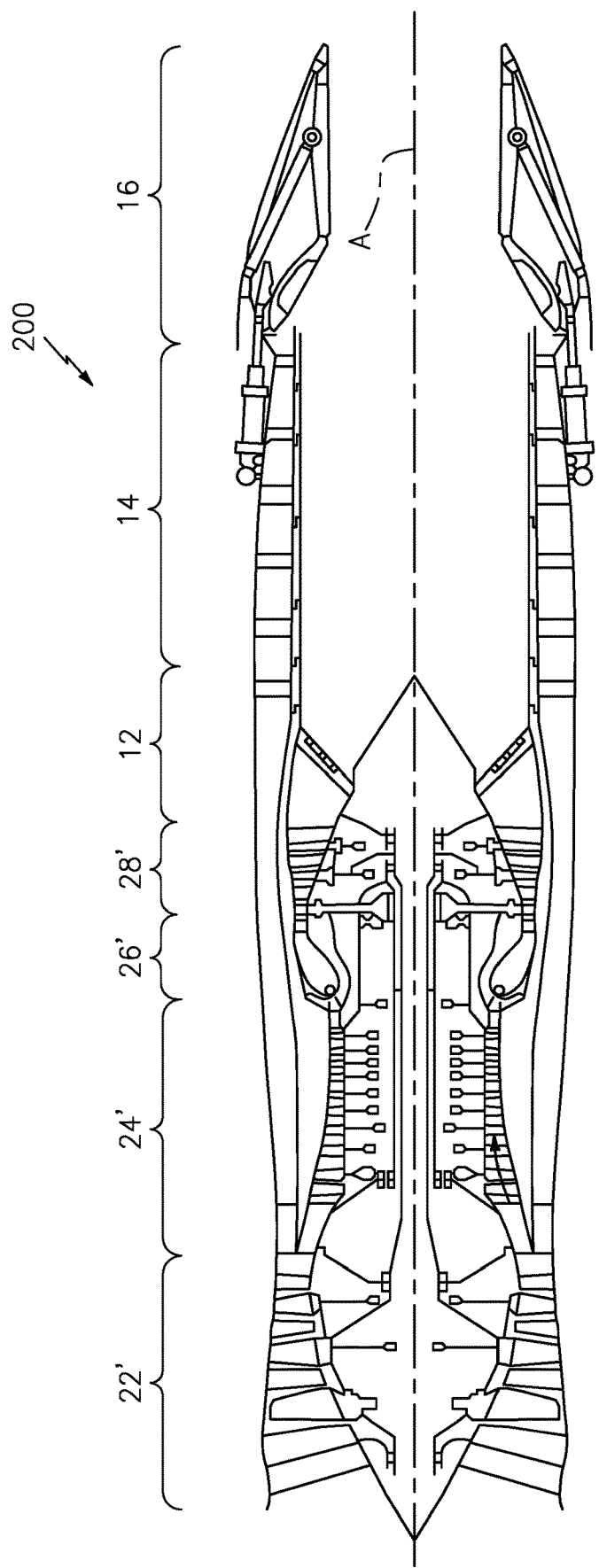
FIG. 2 is a schematic cross-section of another example gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. Alternative engine architectures 200 might include an augmentor section 12, an exhaust duct section 14 and a nozzle section 16 (see FIG. 2) among other systems or features. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbo- fans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis A relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 may drive the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and a high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis A which is collinear with their longitudinal axes.

Core airflow is compressed by the LPC 44 then the HPC 52, mixed with the fuel and burned in the combustor 56, then expanded over the HPT 54 and the LPT 46. The turbines 46, 54 rotationally drive the respective low spool 30 and high spool 32 in response to the expansion. The main engine shafts 40, 50 are supported at a plurality of points by the bearing structures 38 within the static structure 36. It should be understood that various bearing structures 38 at various locations may alternatively or additionally be provided.

Figure 3:
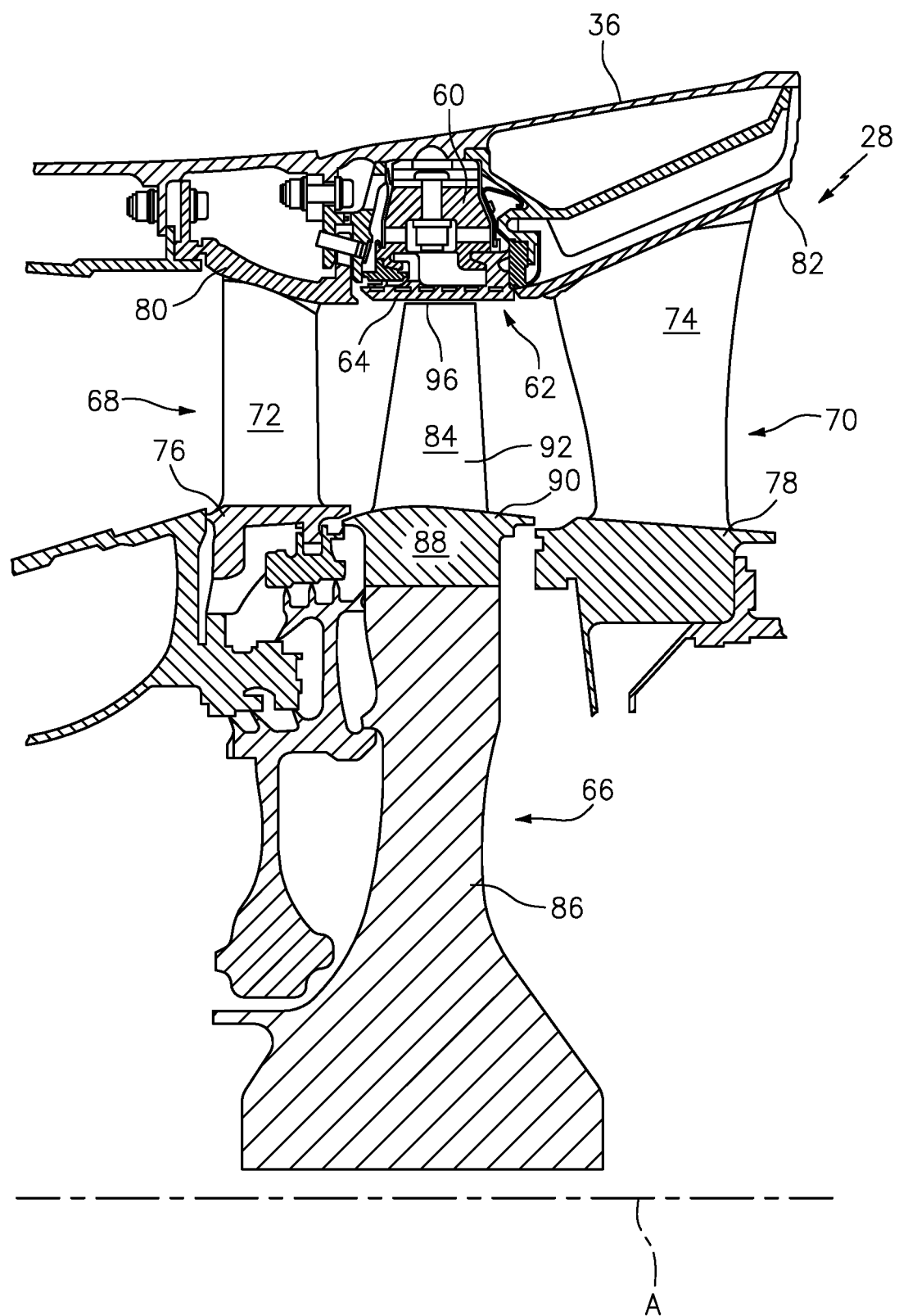
FIG. 3 is an enlarged schematic cross-section of an engine turbine section.

With reference to FIG. 3, an enlarged schematic view of a portion of the turbine section 28 is shown by way of example; however, other engine sections will also benefit herefrom. A full ring shroud assembly 60 within the engine case structure 36 supports a blade outer air seal (BOAS) assembly 62 with a multiple of BOAS segments 64 proximate to a rotor assembly 66 (one schematically shown).

The full ring shroud assembly 60 and the blade outer air seal (BOAS) assembly 62 are axially disposed between a forward stationary vane ring 68 and an aft stationary vane ring 70. Each vane ring 68, 70 includes an array of vanes 72, 74 that extend between a respective inner vane support 76, 78 and an outer vane support 80, 82. The outer vane supports 80, 82 are attached to the engine case structure 36.

Figure 4:
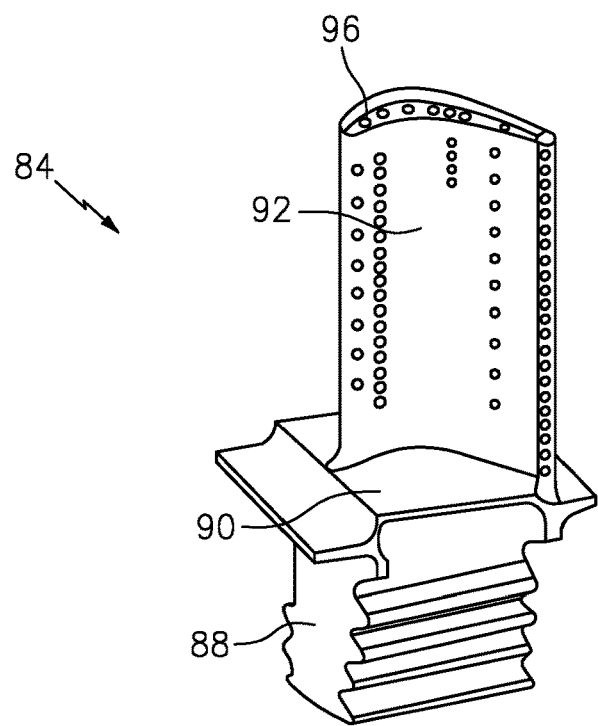
FIG. 4 is a perspective view of a turbine blade as an example component with internal passages.

The rotor assembly 66 includes an array of blades 84 circumferentially disposed around a disk 86. Each blade 84 includes a root 88, a platform 90 and an airfoil 92 (also shown in FIG. 4). The blade roots 88 are received within a rim 94 of the disk 86 and the airfoils 92 extend radially outward such that a tip 96 of each airfoil 92 is closest to the blade outer air seal (BOAS) assembly 62. Each BOAS segment 64 may be manufactured of an abradable material to accommodate potential interaction with the rotating blade tips 96.

Figure 5:
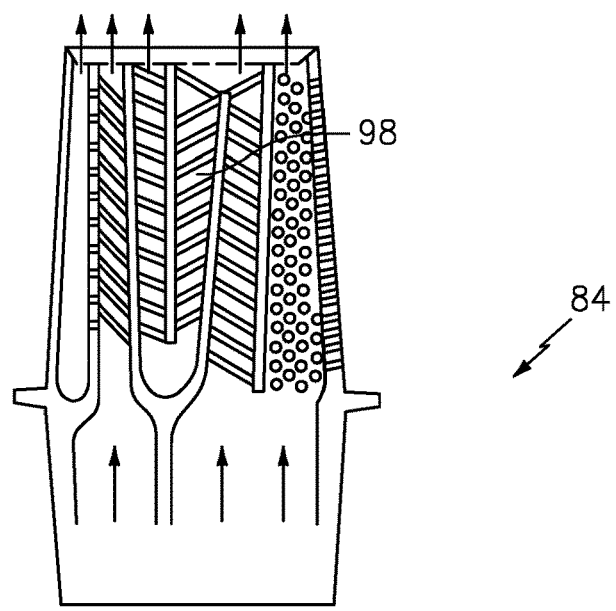
FIG. 5 is a schematic cross-section view of the showing the internal passages.

To resist the high temperature stress environment in the hot gas path of a turbine engine, each blade 84 may be formed by casting as a single crystal material. It should be appreciated that although a blade 84 with internal passageways 98 (see FIG. 5) will be described and illustrated in detail, other components including, but not limited to, vanes, fuel nozzles, airflow swirlers, combustor liners, turbine shrouds, vane endwalls, airfoil edges and other gas turbine engine components W may also be manufactured in accordance with the teachings herein.

While not to be limited to any single method, an additive manufacturing process may be utilized to form a crucible 100 (see FIG. 6) to cast the blade 84 and internal passageways 98 therein. Example additive manufacturing processes include, but are not limited to, Sterolithography (SLS), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Direct Metal Laser Sintering (DMLS) and others. The additive manufacturing process facilitates manufacture of relatively complex components, minimize assembly details and minimize multi-component construction. The additive manufacturing process essentially "grows" articles from three-dimensional information, for example, a three-dimensional computer aided design (CAD) model. The three-dimensional information is converted into a plurality of slices, each slice defining a cross section of the article for a predetermined height of the slice. The additive manufactured component is then "grown" slice by slice, or layer by layer.

Figure 6:
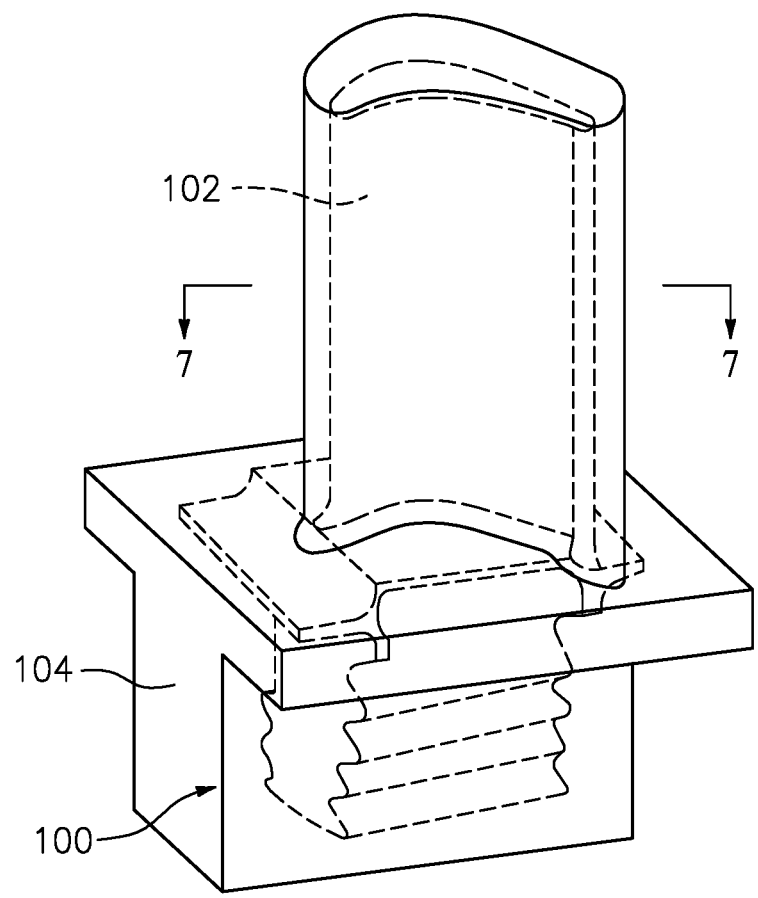
FIG. 6 is a perspective view of a crucible for casting the turbine blade.
Figure 7:
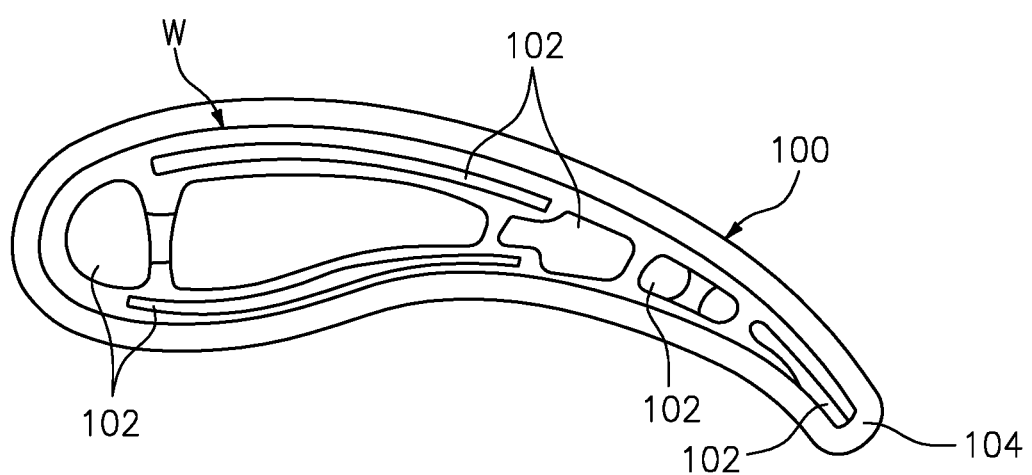
FIG. 7 is a schematic lateral cross-section view of the example component with internal passages within the crucible.

With reference to FIG. 6, the additive manufactured crucible 100 generally includes a core 102 and a shell 104. The shell 104 generally defines the outer surface of the component W while the core 102 forms the internal surfaces such as the internal passages. That is, during the casting process, the core 102 fills a volume that, when removed from the finished casting, defines the internal passageways 98 utilized for cooling airflow. The shell 104 and the core 102 provide a mold to cast complex exterior and interior geometries and may be formed of refractory metals, ceramic, or hybrids thereof. The crucible 100 thereby operates as a melting unit and/or a die.

Figure 8:
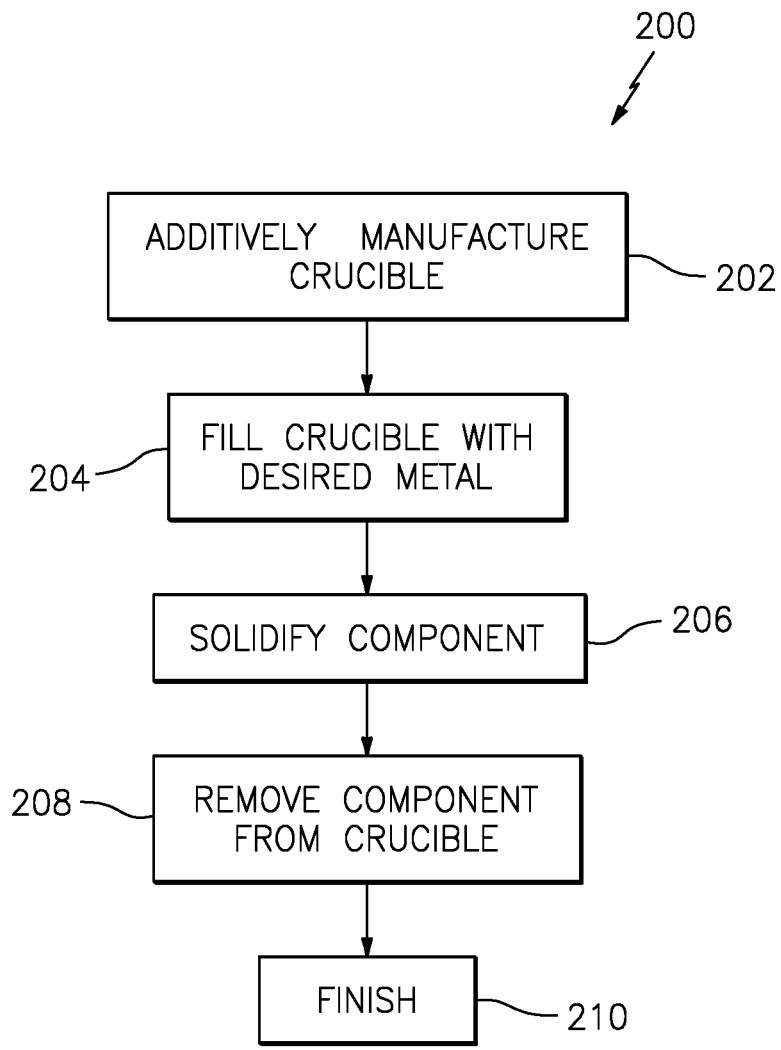
FIG. 8 is a flow chart of one disclosed non-limiting embodiment of a method for fabricating an example component with internal passages.

With reference to FIG. 8, while not to be limited to any single method of additive manufacture, a method 200 according to one disclosed non-limiting embodiment for forming single crystal superalloy component with internal passageways is often termed a crucible, lost wax or shell mold casting process.

In method 200, the crucible 100 is additively manufactured (Step 202). It should be appreciated that the core 102 and/or shell 104 of the crucible 100 may be additively manufactured from feedstock materials that include but are not limited to ceramic material such as silica, alumina, zircon, cobalt, mullite, kaolin, refractory metals, hybrids as well as others.

Following additive manufacture, the crucible 100 may be dried and fired (e.g., bisqued) at an intermediate temperature before high firing to fully sinter and densification. The additively manufactured crucible 100 thereby forms a cavity for casting of the component W. That is, the crucible 100 is integrally formed by the additive manufacturing process such that the conventional separate manufacture of the core and shell are essentially combined into a single step. It should be appreciated that single or multiple molds and cavities may be additively manufactured and assembled.

Next, the crucible may be filled with a desired metal (Step 204). The desired metal may include but not be limited to a superalloy or other material such as nickel based superalloy, cobalt based superalloy, iron based superalloy, and mixtures thereof in the form of a metal powder that is melted; a molten superalloy that is then solidified; or other material. In another non-limiting embodiment, the crucible may be filled with a molten superalloy directly.

Alternatively, or in addition, a single crystal starter seed or grain selector may be utilized to enable a single crystal to form when solidifying the component (Step 206). The solidification may utilize a chill block in a directional solidification furnace. The directional solidification furnace has a hot zone that may be induction heated and a cold zone separated by an isolation valve. The chill block and additively manufactured crucible 100 may be elevated into the hot zone and filled with molten super alloy. After the pour, or being molten, the chill plate may descend into the cold chamber causing a solid/liquid interface to advance from the partially molten starter seed in the form of a single crystallographic oriented component whose orientation is dictated by the orientation of the starter seed. Casting is performed under an inert atmosphere or vacuum to preserve the purity of the casting.

Following solidification, the additively manufactured crucible 100 may be removed from the solidified component W such as by caustic leaching, to leave the finished single crystal component (Step 208). After removal, the component W may be further finished such as by machining, threading, surface treating, coating or any other desirable finishing operation (Step 210).

Figure 9:
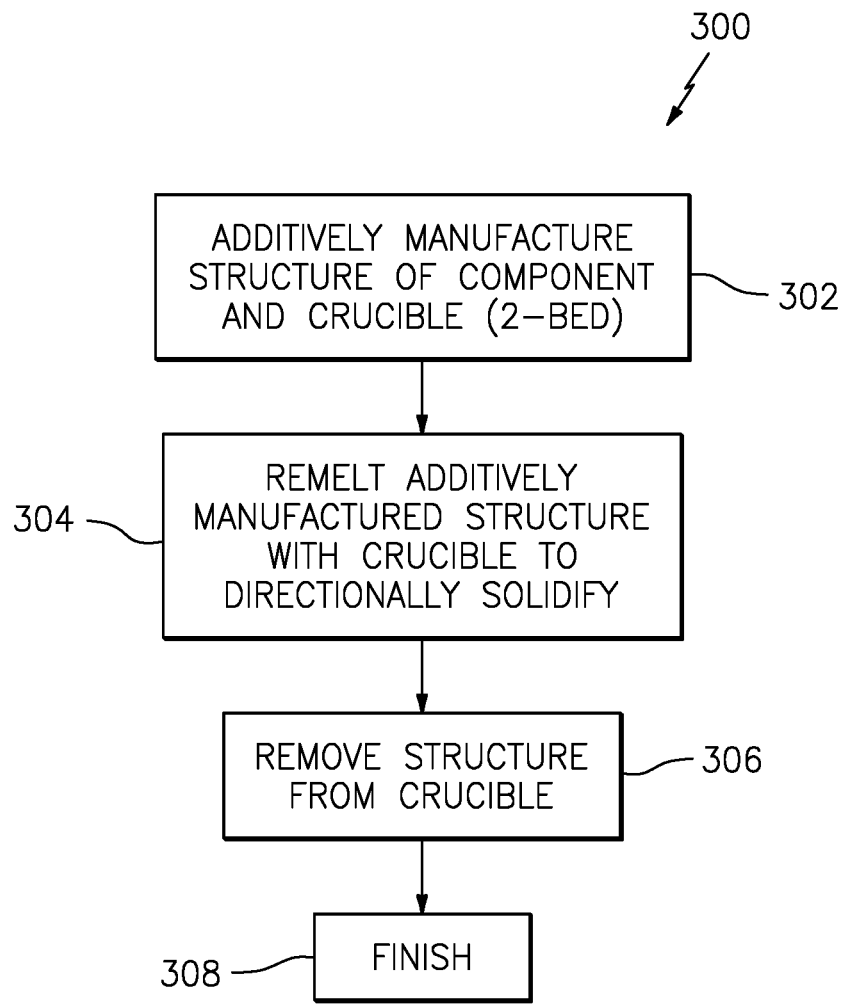
FIG. 9 is a flow chart of another disclosed non-limiting embodiment of a method for fabricating an example component with internal passages.

With reference to FIG. 9, a method 300 according to another disclosed non-limiting embodiment is initiated by first additively manufacturing the component W; e.g., a turbine blade, vane or other component with internal cooling passages (Step 302). Again, various blades, vanes, fuel nozzles, airflow swirlers and other gas turbine engine components may also be manufactured in accordance with the teachings herein.

Figure 10:
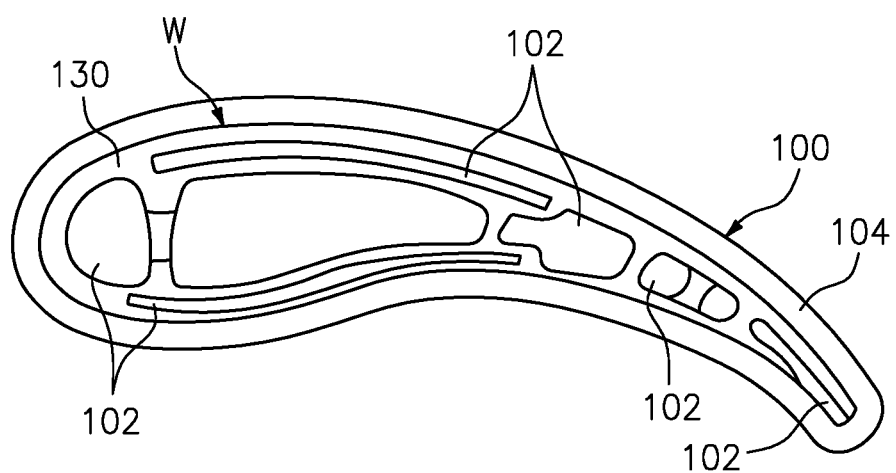
FIG. 10 is a lateral cross-section view of an example component with internal passages within a crucible as manufactured by the method of FIG. 9.

In this disclosed non-limiting embodiment, the additively manufactured component W is manufactured with a multi-feedstock additive manufacturing process such as a two-powder bed system. A structure 130 of the component W is manufactured of the desired superalloy while the core 102 and shell 104 of the crucible 100 are manufactured of a different material such as a ceramic, a refractory metal, or other material which is later removed (see FIG. 10). That is, the location for the internal cooling passages of the component W are additively manufactured of the ceramic, refractory metal, or other material core 102 that is later removed and the shell 104 that surrounds the structure 130 is also additively manufactured of the ceramic, refractory metal, or other material that is later removed.

The structure 130 of the component W, being additively manufactured, may be a polycrystalline superalloy that may not be acceptable as a component in the gas turbine engine such as within the turbine section. That is, the structure 130 may require a single crystal microstructure to withstand the high temperature, high stress operating environment of the gas turbine engine that is not typically achieved by direct additive manufacture.

To thereby facilitate formation of the single crystal microstructure the additively manufactured superalloy structure 130 is re-melted within the crucible 100 (Step 304). That is, the additively manufactured superalloy structure 130 is re-melted and directionally solidifying to form a metal single crystal structure within the additively manufactured crucible 100 that were concurrently additively manufactured in step 302. As described above, the solidification of the superalloy structure 130 may utilize a chill block in a directional solidification furnace. It should be appreciated that various solidification processes that may include the chill plate, withdrawal rate, and pigtail or starter seed to directional solidify the molten material into single crystal if so desired.

Following solidification, the additively manufactured crucible 100 may be removed from the solidified component W such as by caustic leaching, to leave the finished single crystal component (Step 306). After removal, the component W may be further finished such as by machining, threading, surface treating, coating or any other desirable finishing operation (Step 308).

Figure 11:
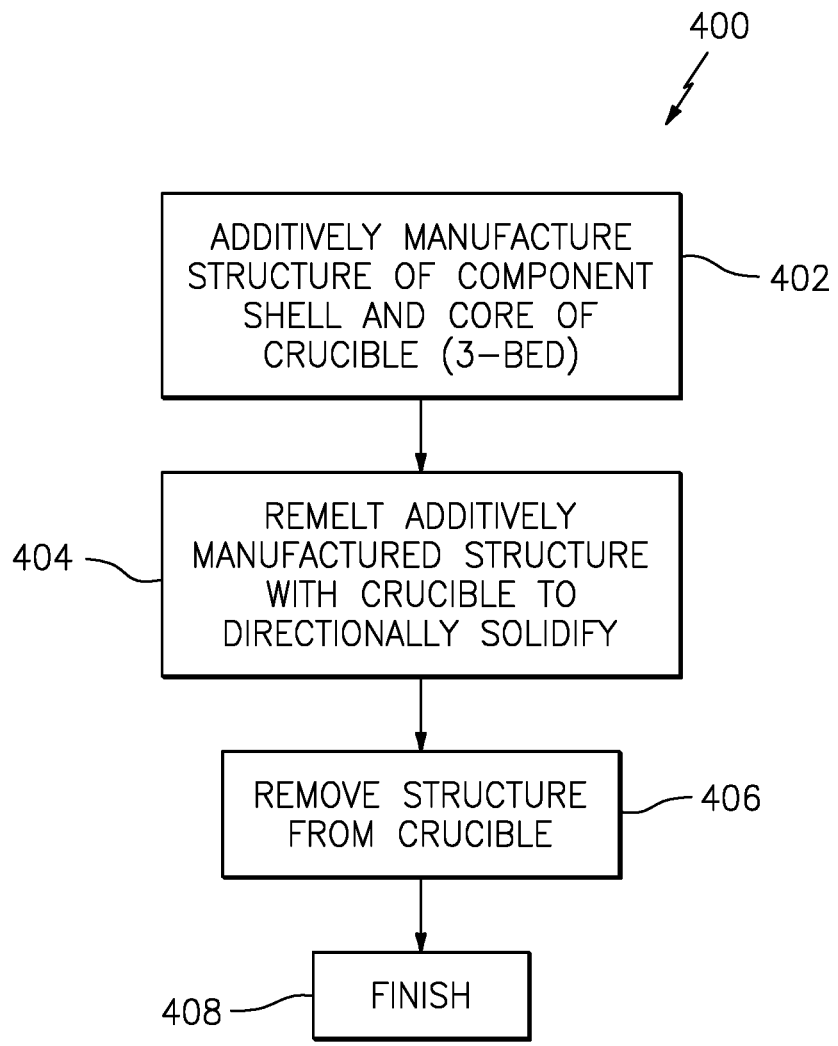
FIG. 11 is a flow chart of another disclosed non-limiting embodiment of a method for fabricating an example component with internal passages.

With reference to FIG. 11, a method 400 according to another disclosed non-limiting embodiment is initiated with the additively manufactured component W manufactured with a multi-feedstock additive manufacturing process such as three-powder bed system (Step 402).

Figure 12:
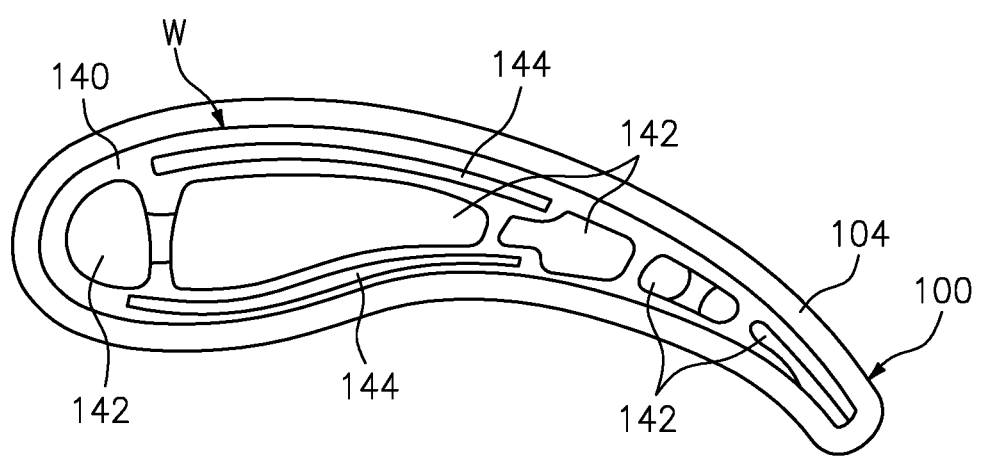
FIG. 12 is a lateral cross-section view of an example component with internal passages within a crucible as manufactured by the method of FIG. 11.

A structure 140 of the component W is manufactured of the desired superalloy while the core 102 and shell 104 of the crucible 100 are manufactured of a different material (see FIG. 12). Locations for the internal cooling passages 142 of the component W are additively manufactured of ceramic material and locations for microcircuits 144 of the component W are additively manufactured of a refractory metal material. The microcircuit 144 is relatively smaller than, and may be located outboard of, the internal cooling passages 142 to facilitate tailorable, high convective efficiency cooling. The microcircuits may be formed of refractory metals to include not be limited to molybdenum (Mo) and Tungsten (W) that possess relatively high ductility for formation into complex shapes and have melting points that are in excess of typical casting temperatures of nickel based superalloys but can be removed, such as through chemical removal, thermal leeching, or oxidation methods, leaving behind a cavity forming the microcircuit 144.

As described above, to facilitate formation of the single crystal microstructure, the additively manufactured superalloy is re-melted within the crucible 100 (Step 404) formed in the step 402. As also described above, it should be appreciated that various solidification processes that may include the chill plate, withdrawal rate, and pigtail or starter seed to directional solidify the molten material into single crystal if so desired.

Following solidification, the additively manufactured crucible 100 may be removed from the solidified component W such as by caustic leaching, to leave the finished single crystal structure 140 of the component W (Step 406). After removal, the component W may be further finished such as by machining, threading, surface treating, coating or any other desirable finishing operation (Step 408).

Figure 13:
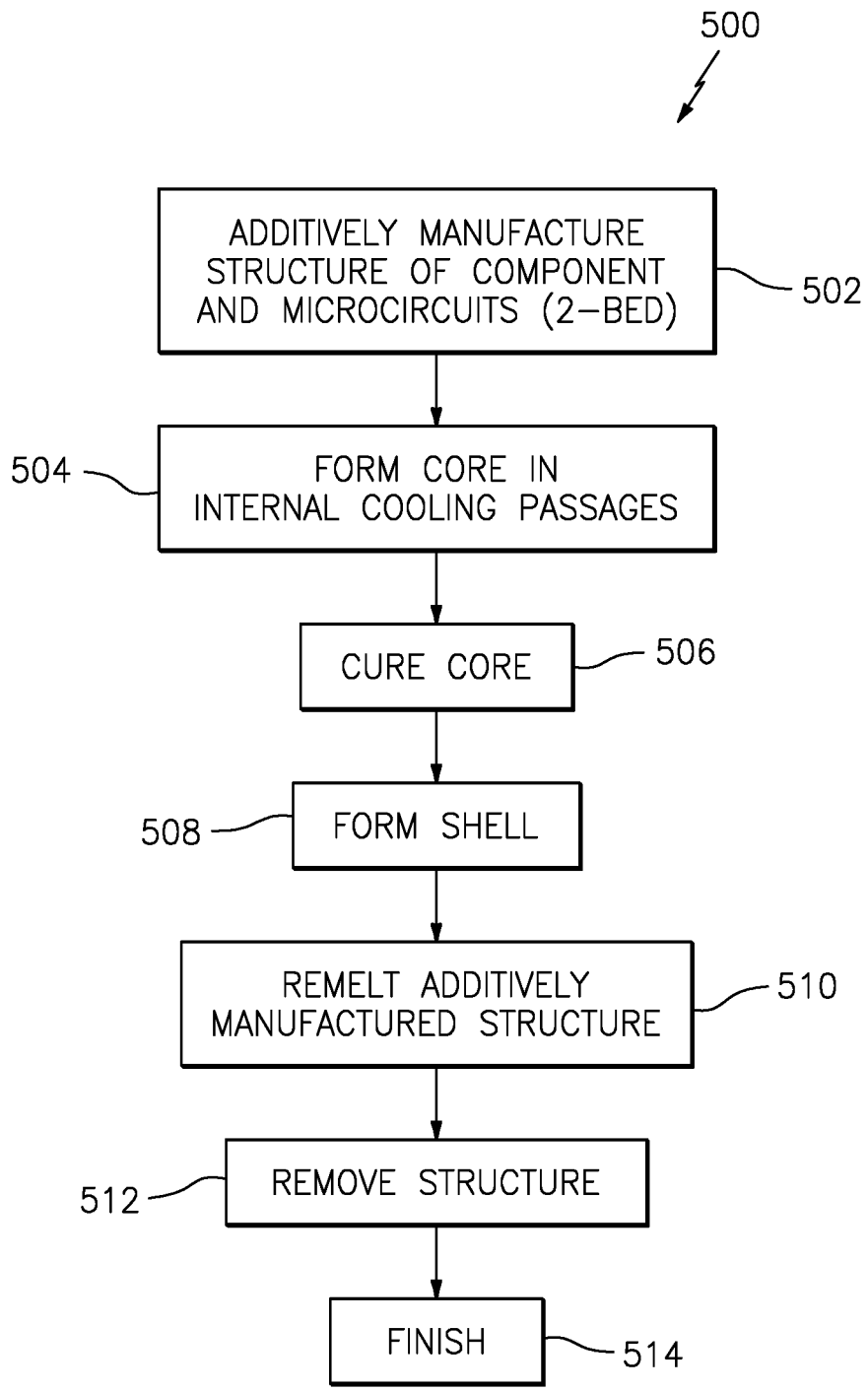
FIG. 13 is a flow chart of another disclosed non-limiting embodiment of a method for fabricating an example component with internal passages.
Figure 14:
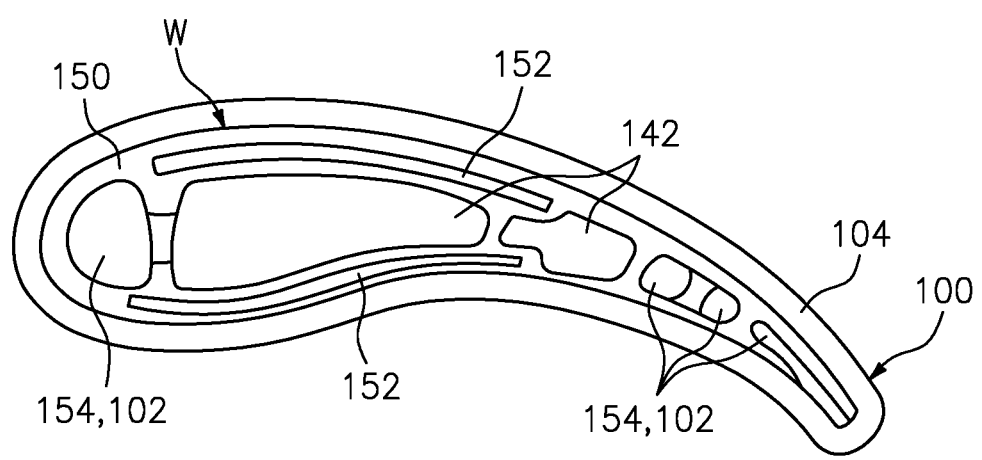
FIG. 14 is a lateral cross-section view of an example component with internal passages within a crucible as manufactured by the method of FIG. 13.

With reference to FIG. 13, a method 500 according to another disclosed non-limiting embodiment is initiated with the additively manufactured component W manufactured with a multi-feedstock additive manufacturing process such as two-powder bed system (Step 502). A structure 150 of the component W is manufactured of the desired superalloy while microcircuits 152 of the component W are additively manufactured of a refractory metal material. That is, the refractory metal material is additively manufactured within the structure 150 where the microcircuits will be.

In this disclosed non-limiting embodiment, the internal cooling passages 154 of the component W may be filled with a ceramic slurry to form the core 102 (Step 504). The slurry may include, but is not be limited to, ceramics commonly used as core materials including, but not limited to, silica, alumina, zircon, cobalt, mullite, and kaolin. In the next step, the ceramic core may be cured in situ by a suitable thermal process if necessary (Step 506).

Next, a ceramic shell may then be formed over the structure 150 and internal ceramic core (Step 508). The ceramic shell may be formed over the structure 150 and the ceramic core by dipping into a slurry of shell mold ceramic powder and binder to form a layer of ceramic. The layer is dried and the process repeated for as many times as necessary to form a green (e.g., unfired) ceramic shell mold. The thickness of the green ceramic shell mold at this step may be from about 0.2-1.3 inches (5-32 mm). The green shell mold may then be bisque fired at an intermediate temperature to partially sinter the ceramic and burn off the binder material. The mold may then be high fired at a temperature between about 1200° F. (649° C.) to about 1800° F. (982° C.) from about 10 to about 120 minutes to sinter the ceramic to full density to form the shell mold.

As described above, to facilitate formation of the single crystal microstructure, the additively manufactured superalloy is re-melted within the crucible 100 (Step 510). As also described above, the solidification of the superalloy structure 150 may utilize a chill block in a directional solidification furnace. It should be appreciated that various solidification processes that may include the chill plate, withdrawal rate, and pigtail or starter seed to directional solidify the molten material into single crystal if so desired.

Following solidification, the additively manufactured crucible 100 may be removed from the solidified component W such as by caustic leaching, to leave the finished single crystal structure 150 of the component W (Step 512). After removal, the component W may be further finished such as by machining, threading, surface treating, coating or any other desirable finishing operation (Step 514).

Figure 15:
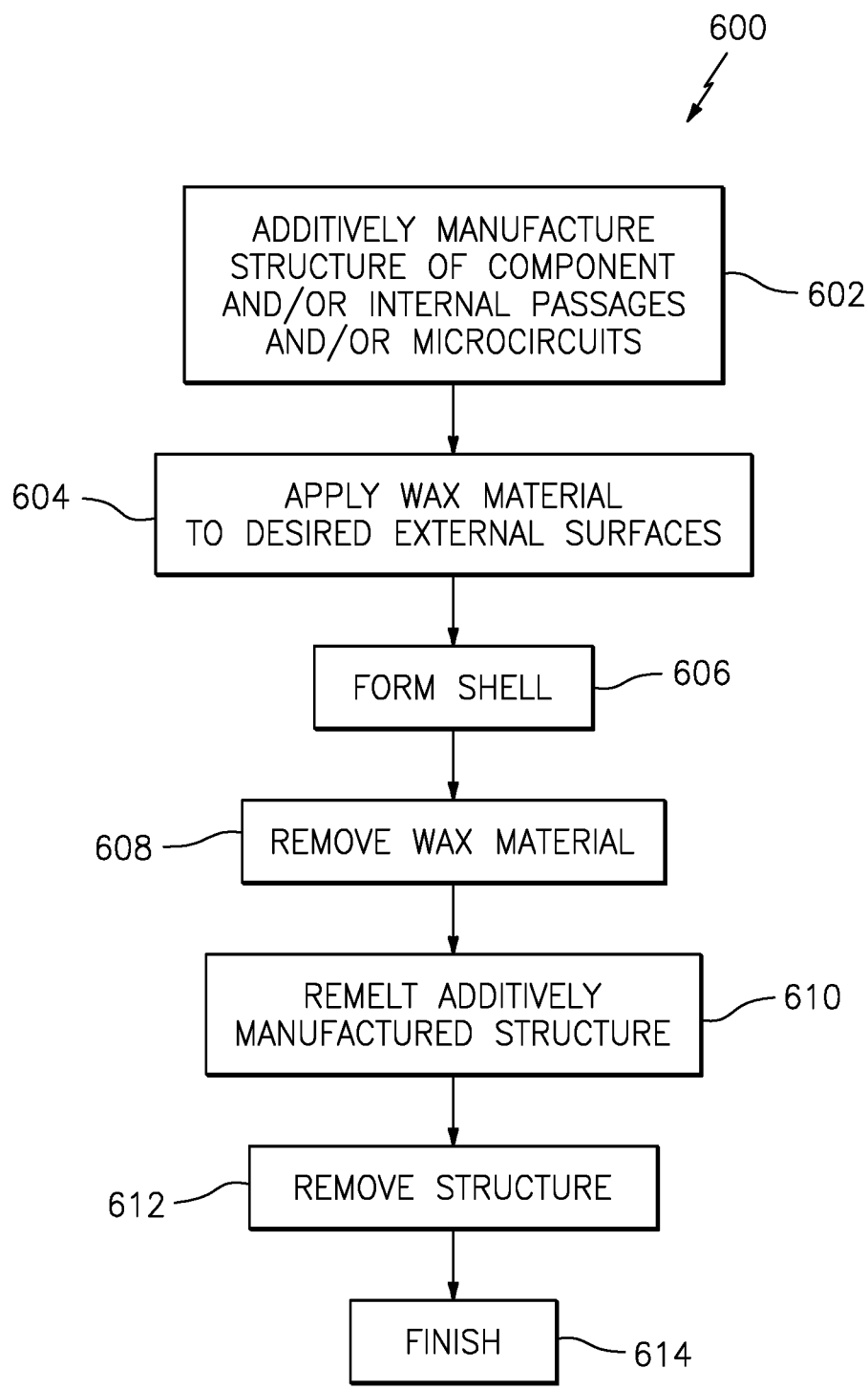
FIG. 15 is a flow chart of another disclosed non-limiting embodiment of a method for fabricating an example component with internal passages.

With reference to FIG. 15, a method 600 according to another disclosed non-limiting embodiment facilitates a high quality surface finish. As described above, the additively manufactured structure of the component W is formed of a desired superalloy that itself forms the cavity pattern for the crucible. The additively manufactured structure of the component W is then re-melted within the crucible to facilitate formation of the single crystal microstructure. However, the crucible, being formed by the additive manufactured structure, may have a relatively poor surface finish typically not acceptable for use as a blade or vane in the gas turbine engine. That is, the airfoil surfaces of the blade and vanes in the gas turbine engine necessarily require particular contour tolerances and surface finishes that are typically not achieved by direct additive manufacture or may not be achieved in an additive manufacturing process within a reasonable cycle time.

To further improve the surface finish, the structure 160 of the component W is additively manufactured of the desired superalloy (Step 602) as described above with desired internal cooling passages 162 and/or microcircuits 164 filled with a core ceramic slurry or be additively manufactured. That is, any of the above-described embodiments that additively manufacture the structure and/or the core of the crucible may initially be utilized.

Figure 16:
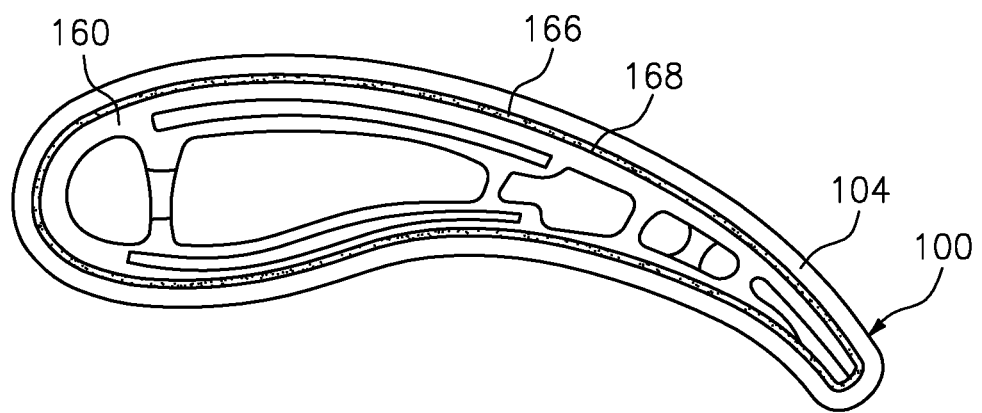
FIG. 16 is a lateral cross-section view of an example component with internal passages within a crucible and coated with a wax layer as manufactured by the method of FIG. 15.

Next, a relatively thin layer of a wax material 166 is applied to an external, aerodynamic surface 168 of the structure 160 such as the airfoil section of a turbine blade (Step 604; FIG. 16). The wax material essentially smoothens the relatively rough surface of the as additively manufactured structure 160.

Next, a ceramic shell 104 is formed over the additively manufactured structure 160 (Step 606). The ceramic shell may be formed over the additively manufactured structure 160 by dipping or other process.

The relatively thin layer of a wax material 166 is then removed (Step 608). The relatively thin layer of a wax material 166 may be removed by heating or other operation that but does not otherwise effect the additively manufactured structure 160.

Then, as described above, to facilitate formation of the single crystal microstructure the additively manufactured superalloy structure 160 is re-melted within the shell of the crucible (Step 610). As also described above, it should be appreciated that various solidification processes that may include the chill plate, withdrawal rate, and pigtail or starter seed to directional solidify the molten material into single crystal if so desired. It should be further appreciated that the re-melting (Step 610) may alternatively be combined with the removal of the relatively thin layer of a wax material 166 (Step 608).

Following solidification, the solidified component W may be removed from the crucible by caustic leaching, to leave the finished single crystal structure 160 of the component W (Step 612). After removal, the component W may be further finished such as by machining, threading, surface treating, coating or any other desirable finishing operation (Step 614).

The method disclosed herein facilitates the relatively rapid additive manufacture of single crystal microstructure components with complex internal passages and heretofore unavailable surface finishes to withstand the high temperature, high stress operating environment of a gas turbine engine environment.

It should be understood that relative positional terms such as "forward," "aft," "upper," "lower," "above," "below," and the like are with reference to the normal operational attitude of the vehicle and should not be considered otherwise limiting.

It should be understood that like reference numerals identify corresponding or similar elements throughout the several drawings. It should also be understood that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the features within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method of manufacturing a component, the method comprising:
   additively manufacturing the component of a metal material;
   additively manufacturing a core at least partially within the component;
   at least partially encasing the additively manufactured component and the additively manufactured core within a shell;
   melting the additively manufactured component;
   directionally solidifying the metal material of the additively manufactured component to form a metal single crystal material component; and
   removing the shell and the additively manufactured core to reveal the metal single crystal material component with internal passageways.

2. The method of claim 1, wherein the metal material is a powder.

3. The method of claim 1, wherein the core at least partially defines the internal passageways within the component.

4. The method of claim 3, further comprising concurrently additively manufacturing the component of the metal material and the core within the component.

5. The method of claim 3, wherein the core at least partially defines microchannels within the component.

6. The method of claim 5, wherein the microchannels are additively manufactured of a refractory material and the internal passageways are manufactured of a ceramic material.

7. The method of claim 6, wherein the additive manufacturing is performed by a multi-powder bed system.

8. The method of claim 1, further comprising applying a wax material at least partially onto the component.

9. The method of claim 8, further comprising melting the wax material prior to melting the additively manufactured component.

10. The method of claim 8, further comprising applying the wax material to an airfoil portion of the component.

11. A manufacturing method, comprising:
    providing a component comprising a metal material;
    additively manufacturing a core at least partially within the component;
    at least partially encasing the component and the core within a shell;
    melting the metal material of the component;
    directionally solidifying the metal material of the component to form a metal single crystal material component; and
    removing the shell and the core to reveal the metal single crystal material component with internal passageways.

12. The manufacturing method of claim 11, wherein the providing of the component comprises additively manufacturing the component from the metal material.

13. The manufacturing method of claim 11, wherein the core at least partially forms the internal passageways within the metal single crystal material component.

* * * * *